(12) United States Patent
Mallinson

(10) Patent No.: US 11,593,629 B2
(45) Date of Patent: Feb. 28, 2023

(54) HYBRID DELTA MODULATOR AS NEURON WITH MEMORY

(71) Applicant: SiliconIntervention Inc., Kelowna (CA)

(72) Inventor: A. Martin Mallinson, Kelowna (CA)

(73) Assignee: SiliconIntervention Inc., Kelowna (CA)

( * ) Notice: Subject to any disclaimer, the term of this patent is extended or adjusted under 35 U.S.C. 154(b) by 442 days.

(21) Appl. No.: 16/820,704

(22) Filed: Mar. 16, 2020

(65) Prior Publication Data

US 2020/0302280 A1    Sep. 24, 2020

Related U.S. Application Data

(60) Provisional application No. 62/819,868, filed on Mar. 18, 2019.

(51) Int. Cl.
*G06N 3/063* (2023.01)
*G06N 3/04* (2023.01)
*H03M 3/02* (2006.01)

(52) U.S. Cl.
CPC ............. *G06N 3/063* (2013.01); *G06N 3/04* (2013.01); *H03M 3/02* (2013.01)

(58) Field of Classification Search
CPC ....... G06N 3/0454; G06N 3/084; G01R 21/00
See application file for complete search history.

(56) References Cited

U.S. PATENT DOCUMENTS

| 11,049,013 | B1* | 6/2021 | Duong | G06N 3/084 |
| 2014/0286386 | A1* | 9/2014 | Rilling | H04B 7/0848 375/232 |
| 2015/0015720 | A1* | 1/2015 | Kim | A61B 8/13 348/222.1 |
| 2015/0035545 | A1* | 2/2015 | Langer | G01R 21/00 324/629 |
| 2017/0228634 | A1* | 8/2017 | Tomita | G06N 3/0454 |

OTHER PUBLICATIONS

"Delta Modulation," Nov. 17, 1999, ("https://www.clear.rice.edu/elec301/Projects99/adda/dmod.html").

(Continued)

*Primary Examiner* — Getente A Yimer
(74) *Attorney, Agent, or Firm* — Gard & Kaslow LLP

(57) ABSTRACT

A hybrid delta modulator that can be used as a variable threshold neuron in a neural network is described. The hybrid delta modulator exhibits a memory of the prior state of the modulator, similar to a delta modulator, and receives a sum-of-products signal from a weighting circuit and generates a quantized output stream that represents the sum-of-products signal, potentially including an activation function and offset. With appropriately selected components, the hybrid delta modulator separates the integral function of the feedback from the gain function. Further, the gain can be selected, and the characteristic of the output pattern can be tailored to include an arbitrary combination of the input and the rate of change of the input. The use of a hybrid delta modulator of the present approach provides a simpler solution and better performance than many prior art neurons.

9 Claims, 6 Drawing Sheets

(56) References Cited

OTHER PUBLICATIONS

Jeffrey L. Elman, "Finding Structure in Time," Apr.-Jun. 1990, Cognitive Science, vol. 14, Issue 2, pp. 179-211.

"Time delay neural network," Wikipedia, Mar. 10, 2019, ("https://en.wikipedia.org/w/index.php?title=Time_delay_neural_network&oldid=887118220").

Guillaume Bellec, Darjan Salaj, Anand Subramoney, Robert Legenstein, Wolfgang Maass, "Long short-term memory and learning-to-learn in networks of spiking neurons," arXiv:1803.09574v4, Dec. 25, 2018, ("https://arxiv.org/abs/1803.09574").

"Spiking neural network," Wikipedia, Mar. 5, 2019, ("https://en.wikipedia.org/w/index.php?title=Spiking_neural_network&oldid=886270211").

"Long short-term memory," Wikipedia, Feb. 22, 2020, ("https://en.wikipedia.org/w/index.php?title=Long_short-term_memory&oldid=942108749").

* cited by examiner

HYBRID DELTA MODULATOR AS NEURON WITH MEMORY

This application claims priority from Provisional Application No. 62/819,868, filed Mar. 18, 2019, which is incorporated by reference herein in its entirety.

FIELD OF THE INVENTION

The present invention relates generally to artificial intelligence (AI) networks, and more particularly to neurons in such AI networks with memory of a previous state.

BACKGROUND OF THE INVENTION

Neural Networks (NN) are the basis of Artificial Intelligence (AI) solutions to problems such as handwriting recognition, image recognition and voice analysis. Certain forms of AI, for example voice or speech analysis, require that the AI system have some knowledge of the signal distributed across time. Speech analysis thus requires that the AI system be able to compare the evolution of the audio signal in time against some learned template.

A class of neural networks known in the art, commonly referred to as Recurrent Neural Networks (RNN), introduce the ability to analyze evolution over time by providing feedback in one or more layers of the neural network. FIG. 1 shows an implementation of one type of AI network, a canonical Elman RNN as is known in the prior art. As known to one of skill in the art, in some implementations of a RNN, such as an Elman or Jordan network, the state of a hidden layer h depends upon the previous state of the hidden layer, i.e., it has memory of its last value.

In network 100 of FIG. 1, for example, it may be seen that neuron $Y_1$ receives, in addition to the current inputs from neurons $X_1$ to $X_L$, an input from neuron $U_1$ that is dependent on the prior state of neuron $Y_1$. As seen in FIG. 1, each of neurons $Y_2$ to $Y_L$ (the Y neurons are often referred to as the "hidden layer") also receives input about its own prior state from neurons $U_2$ to $U_L$ respectively. The equations describing the network introduce such prior state variables by z-domain operations on the current state, using a discrete delay operator $z^{-1}$.

This time dependency is sufficient to allow the network to recognize the evolution of the signal over time, so that, for example, the network can recognize speech or handwriting, or detect anomalies in network traffic or intrusion detection systems (IDSs). Other approaches include Time Delay Neural Networks, which also provide a delayed version of the input to the neural net, and long short-term memory (LSTM), a RNN architecture used in the field of deep learning.

Recently, another approach has been shown to work. Rather than explicitly feedback the prior state of a neuron to itself, the threshold of the neuron may not be constant, but rather may change dependent on the neuron output and recover back to a steady state after removal of the signal. This is sometimes referred to as a "spiking neural network," in which the neuron threshold rises with an input, and then decays back to a baseline level with some time constant.

It is desirable to have a simple way to implement a varying threshold neuron in a neural network such as that of the spiking neural network.

SUMMARY OF THE INVENTION

Described herein is a hybrid delta modulator that may be used in a variable threshold neuron in a neural network.

One embodiment describes a neuron for use in a neural network, comprising: a weighting circuit configured to receive a plurality of input signals and produce a sum-of-products signal by weighting each of the input signals and adding the weighted input signals together; and a modulator circuit configured to receive the sum-of-products signal and produce a quantized output signal representing the sum-of-products signal.

In a further embodiment, the modulator circuit further comprises: a differencing element configured to determine a difference between the sum-of-products signal and a filtered quantized output signal; a quantizer configured to produce the quantized output signal based upon the difference between the sum-of-products signal and the quantized output signal; and, a filter network configured to receive the quantized output signal and produce the filtered quantized output signal.

In a still further embodiment, the filter network further comprises: a resistor coupled at a first end to the quantized output signal and at a second end to an input of the differencing element; and a capacitor coupled at a first end to the second end of the resistor and at a second end to a ground.

In a yet still further embodiment, the quantizer is further configured to produce an output that is the inverse of the quantized output signal, and wherein the filter network further comprises: a first resistor having a first end connected to the inverse quantized output signal and a second end; a capacitor having a first end connected to the second end of the first resistor and a second end connected to an input of the differencing element; a second resistor having a first end connected to the second end of the first resistor and a second end connected to the second end of the capacitor; and an operational amplifier having a first input connected to the second end of the first resistor and a second input connected to a ground, and an output connected to the second end of the capacitor.

In a yet still further embodiment, wherein the quantizer is further configured to produce an output that that is the inverse of the quantized output signal, and wherein the filter network further comprises: a first resistor having a first end connected to the inverse quantized output signal and a second end; a first capacitor having a first end connected to the second end of the first resistor and a second end connected to an input of the differencing element; a second resistor having a first end connected to the second end of the first resistor and a second end connected to the second end of the first capacitor; an operational amplifier having a first input connected to the second end of the first resistor and a second input, and an output connected to the second end of the first capacitor; a third resistor having a first end connected to the quantized output signal and a second end connected to the second input of the operational amplifier; and a second capacitor having a first end connected to the second end of the third resistor and a second end connected to a ground.

DETAILED DESCRIPTION OF THE INVENTION

Described herein is a hybrid delta modulator that may be used in a variable threshold neuron in a neural network. The hybrid delta modulator exhibits a memory of the prior state of the modulator, similar to a delta modulator, and receives a sum-of-products signal from a weighting circuit and generates a quantized output stream that represents the sum-of-products signal, potentially including an activation function and offset.

With appropriately selected components and a weighting circuit to provide the sum-of-products signal, the hybrid delta modulator separates the integral function of the feedback from the gain function. Further, the gain may be selected, and the characteristic of the output pattern may be tailored to include an arbitrary combination of the input and the rate of change of the input.

As is known in the art, a delta modulator is a particular form of modulator having a discrete set of outputs expressed over as few as one bit, having a signal imposed upon these discrete outputs which exhibits noise shaping. For example, a single bit delta modulator accepts a nominally continuous input in the range of, for example, −1 to 1 and outputs a quantized signal of two states that we may represent as either −1 or 1. The average occurrence of −1 or 1 is such that the average value of the output states represents the derivative of the input signal. (In some cases, the quantized signal may be limited to 0 and 1, rather than −1 and 1.)

As is also known in the art, delta modulators are similar to sigma delta ($\Sigma\Delta$) modulators; however, while a sigma delta modulator also outputs a quantized signal, the average output of a sigma delta modulator represents the input signal itself, rather than the derivative of the input signal. The difference is also in the structure of the modulator; where a sigma delta modulator integrates the output of a loop differencing element prior to quantizing that integral, in a delta modulator the sequence is rearranged to quantize the output of the loop differencing element prior to integration in the loop.

Figure 1:
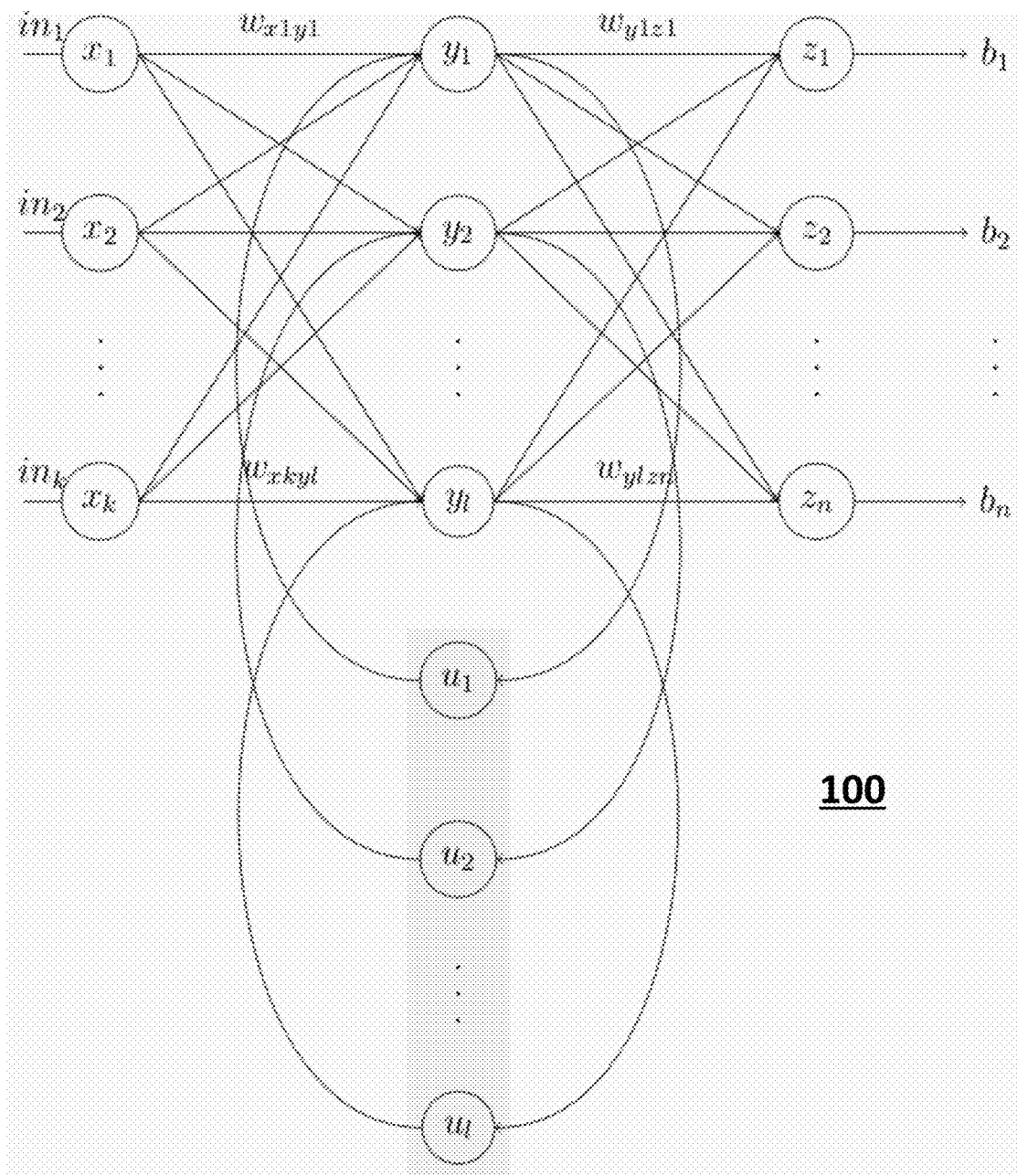
FIG. 1 is a diagram of an implementation of a canonical Elman AI network as is known in the prior art.
Figure 2:
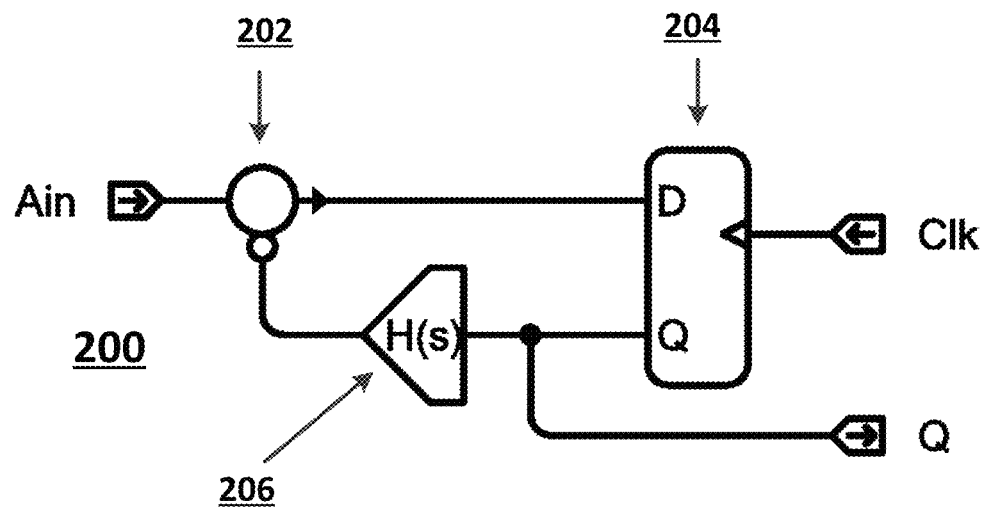
FIG. 2 is a diagram of a delta modulator according to the prior art.

FIG. 2 is a diagram of a delta modulator 200 of the known art; however, while the delta modulator 200 is known, it is believed that it has not previously been used in a neuron in a neural network. A differencing element 202 compares the input signal Ain to the integrated quantized feedback signal from the Q output of a quantizer 204; quantizer 204 may, for example, be a D-type flip flop (DFF). An integrator 206 operates on the output of quantizer 204 and provides the integrated quantized output as a feedback signal to differencing element 202 that is compared to the input signal Ain.

Every clock edge provided by a clock signal Clk will cause quantizer 204 to update the Q output, to a high level if the input at D is high and to a low level if the input at D is low. Integrator 206 may be described in the s-domain (frequency) as having a 1/s characteristic as part of the transfer function, implying that the gain goes to infinity as the frequency s goes to zero, the average value of the integrated Q output of quantizer 204 must equal input signal Ain.

Figure 3:
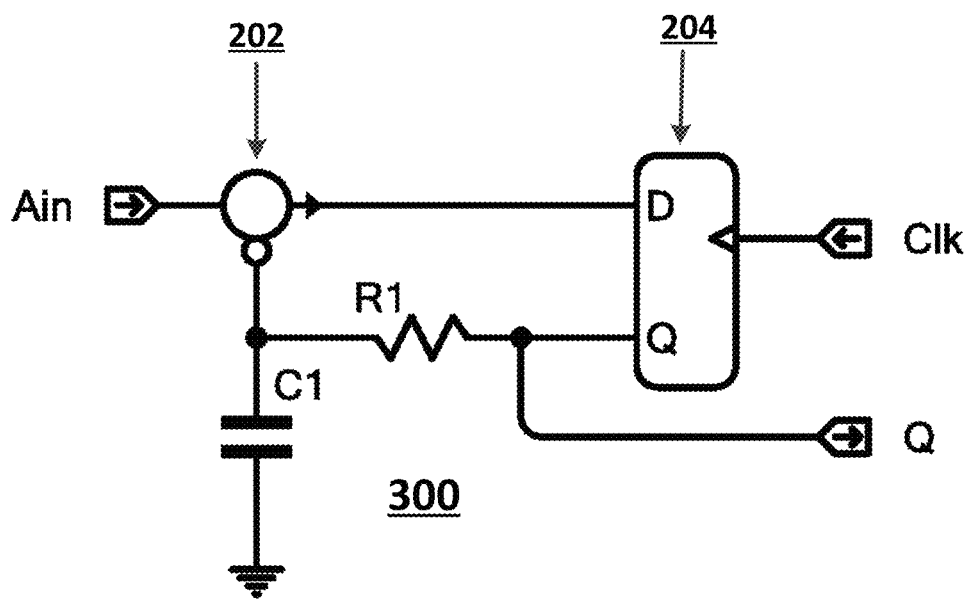
FIG. 3 is a diagram of a modified delta modulator that may be used in a neuron in layers of an AI network according to one embodiment of the present approach.

FIG. 3 is a diagram of a hybrid delta modulator 300 that may be used as a neuron in one or more layers of an AI network according to one embodiment of the present approach. In hybrid delta modulator 300, a modification has been made to the delta modulator 200 of FIG. 2 to introduce a finite gain into the feedback loop of the delta modulator.

Like delta modulator 200 of FIG. 2, hybrid delta modulator 300 of FIG. 3 contains a differencing element 202 that compares the input signal Ain to the quantized feedback signal from the Q output of a quantizer 204. However, integrator 206 of delta modulator 200 has been replaced in hybrid delta modulator 300 by a filter network. The filter network contains a resistor R1 connected to the Q output signal and differencing element 202 and a capacitor C1 connected to one end of resistor R1 (and thus to differencing element 202) and to a ground.

This configuration introduces a finite gain limit into hybrid delta modulator 300. The finite gain limit is due to the filter network of resistor R1 and capacitor C1 not approximating a integrator; as explained above a true integrator may be described in the s-domain as 1/s implying that the gain goes to infinity as the frequency tends to zero. However, if the description in the s-domain of whatever replaces the integrator is changed to $1/(s+a)$, the gain will not tend to zero as the frequency s goes to zero, but rather will be limited to $1/a$ at low frequencies.

The combination of resistor R1 and capacitor C1 as a filter element accomplishes this replacement of the integrator. Hybrid delta modulator 300 now has a description in the s-domain of $1/(1+sRC)$, which has a finite gain of unity as the frequency goes to zero.

The use of the resistor-capacitor filter element also causes hybrid delta modulator 300 to exhibit a hybrid behavior. When the input signal is not changing, the output is that of the sigma delta modulator, i.e., a pattern having an average value equal to the signal. However, when the signal changes, the output is not equal to the signal value, but rather to a weighted sum of the signal value and the derivative of the signal.

Suppose that the output Q of a given quantizer is either 0 or 1800 mV (i.e., 1.8 volts). If the input signal Ain is 200 mV, in the delta modulator 200 of FIG. 2, the output Q of quantizer 204 will output a series of values of Q of 0 and 1800 mV such that the average value provided by integrator 206 to differencing element 202 is 200 mV. If the input signal Ain now changes to 800, the quantizer will change essentially instantly to a different series of Q values, with more values of 1800 mV, such that the average value provided by integrator 206 to differencing element 202 is 800 mV.

Figure 4:
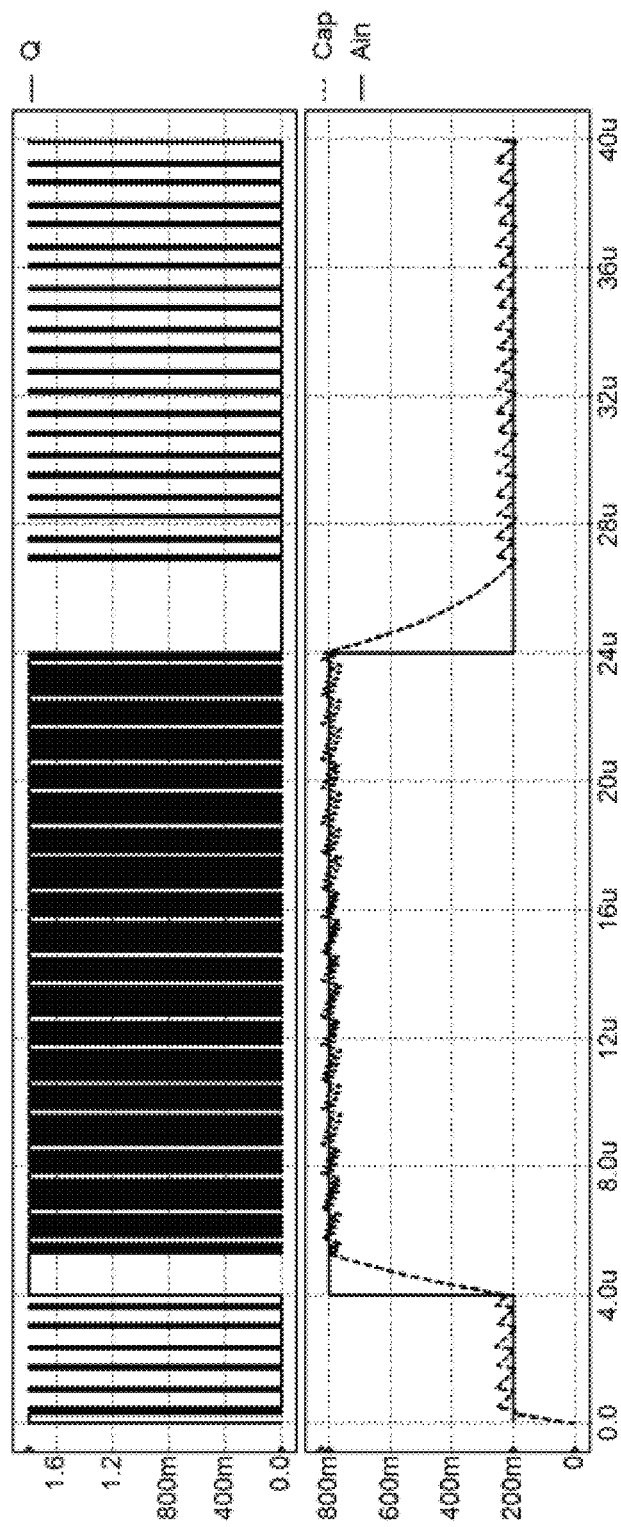
FIG. 4 shows graphs of signals in the circuit of FIG. 3.

However, in a hybrid delta modulator, the change is not instantaneous. FIG. 4 shows the behavior of a single bit finite gain delta modulator such as hybrid delta modulator 300 of FIG. 3 when a step change is present on the input Ain. The curve "Ain" shows the step change, curve "Cap" is the voltage on the capacitor and curve "Q" is the digital output.

As seen in FIG. 4, the input signal Ain has a step change from 200 millivolts (mV) to 800 mV at 4 microseconds ($\mu$S). The output pattern "Q" in the time period from about 5 $\mu$S to 24 $\mu$S shows the alternating value of Q that is necessary for its average to represent the input Ain of 800 mV, while the output pattern of Q in the time period from 27 $\mu$S to 40 $\mu$S is that necessary for the average value of Q to represent the input Ain of 200 mV. These periods reflect the same Q outputs that would be seen in the delta modulator 200 of FIG. 2.

However, note that now there are transition periods from 4 µS to 5 µS and from 24 µS to 27 µS during which the output signal Q does not represent the input signal Ain. Starting at 4 µS, when the input signal Ain steps up, the value of Q goes to its highest level and stays high for about 1 µS until the value of the capacitor C1 catches up, as seen on FIG. 4. Similarly, starting at 24 µS, when the signal Ain steps down, the value of Q goes to its lowest level and stays low for about 3 µS until the capacitor C1 discharges.

This means that the system must have some memory of its last value. In fact, that memory is the voltage on the capacitor C1. It is also the reason that such a hybrid delta modulator is able to function as a neuron in a neural network.

The reason for this is that when the input signal Ain changes, capacitor C1 has been charged to the prior value of Ain. In other words, the top of capacitor C1, which is connected to differencing element 302, is at the previous value of Ain, i.e., the voltage that was needed to offset that prior value of Ain. Capacitor C1 cannot discharge instantaneously, and thus the value of Q on the other end of resistor R1, also cannot change instantaneously, but rather is limited by the slew rate of the resistor-capacitor combination, as seen by the changes in the value of "Cap" in FIG. 4 that are not step functions.

In some embodiments, this effect of memory of the prior state of the modulator need not cause the value of Q to saturate as it does in the example of FIG. 4. A more general case of a hybrid delta modulator that exhibits with derivative and signal value gain differing is shown in FIG. 5.

Figure 5:
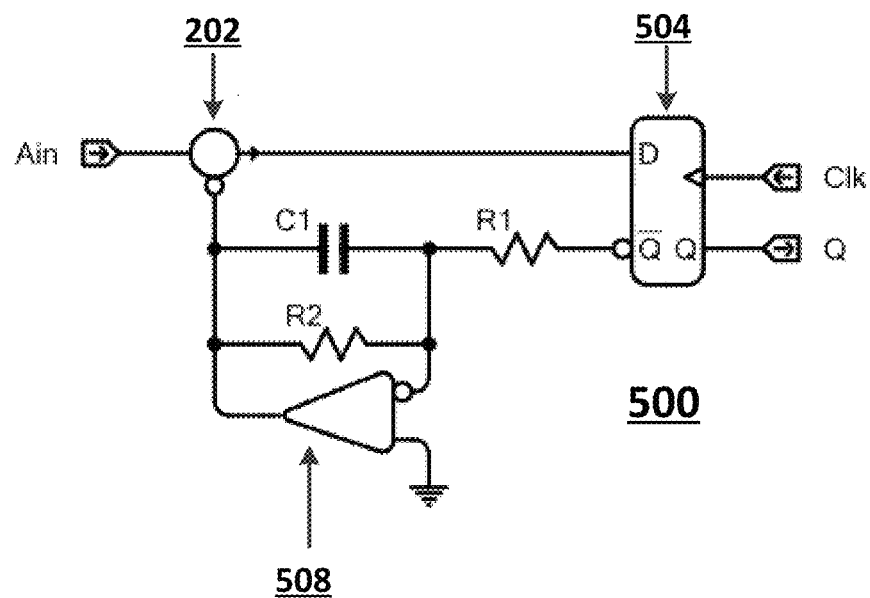
FIG. 5 is a diagram of a modified delta modulator that may be used in a neuron in layers of an AI network according to another embodiment of the present approach.

FIG. 5 is a diagram of a hybrid delta modulator 500 that may be used as a neuron in one or more layers of an AI network according to another embodiment of the present approach. As in the delta modulator 200 of FIG. 2 and hybrid delta modulator 300 of FIG. 3, hybrid delta modulator 500 contains a differencing element 202 that compares the input signal Ain to the quantized feedback signal from the Q output of a quantizer 504. Quantizer 504 is able to generate an inverse of the quantized output signal Q, and thus differs slightly from quantizer 204 of FIG. 2; in the art, the inverted output signal is often denoted as Q with a horizontal line over it, and commonly called "Q bar."

In this embodiment, integrator 206 of delta modulator 200 of FIG. 2 has again been replaced in hybrid delta modulator 500 of FIG. 5 by a filter network, but by a more complex filter network than that of hybrid delta modulator 300 of FIG. 3. In hybrid delta modulator 500, the filter network contains a first resistor R1 connected at one end to the Q output signal, and at the other end to a capacitor C1, a second resistor R2 and one input of an operational amplifier ("op-amp") 508. The other input to op-amp 508 is connected to a ground, while the other ends of capacitor C1 and second resistor R2, and the output of op-amp 508, are connected to differencing element 502.

This configuration allows adjustment of the gain. If resistor R2 is made an open circuit, i.e., its value is infinite, the filter network looks like a perfect integrator and hybrid delta modulator 500 becomes a normal delta modulator with the possibility of infinite gain. With resistor R2 present, the hybrid delta modulator has a finite gain of R2/R1. Thus, the integral function of the feedback has been separated from the gain function. (Because this feedback will invert the signal, the feedback is "Q bar" from quantizer 504, i.e., the inverted version of the output Q.)

Figure 6:
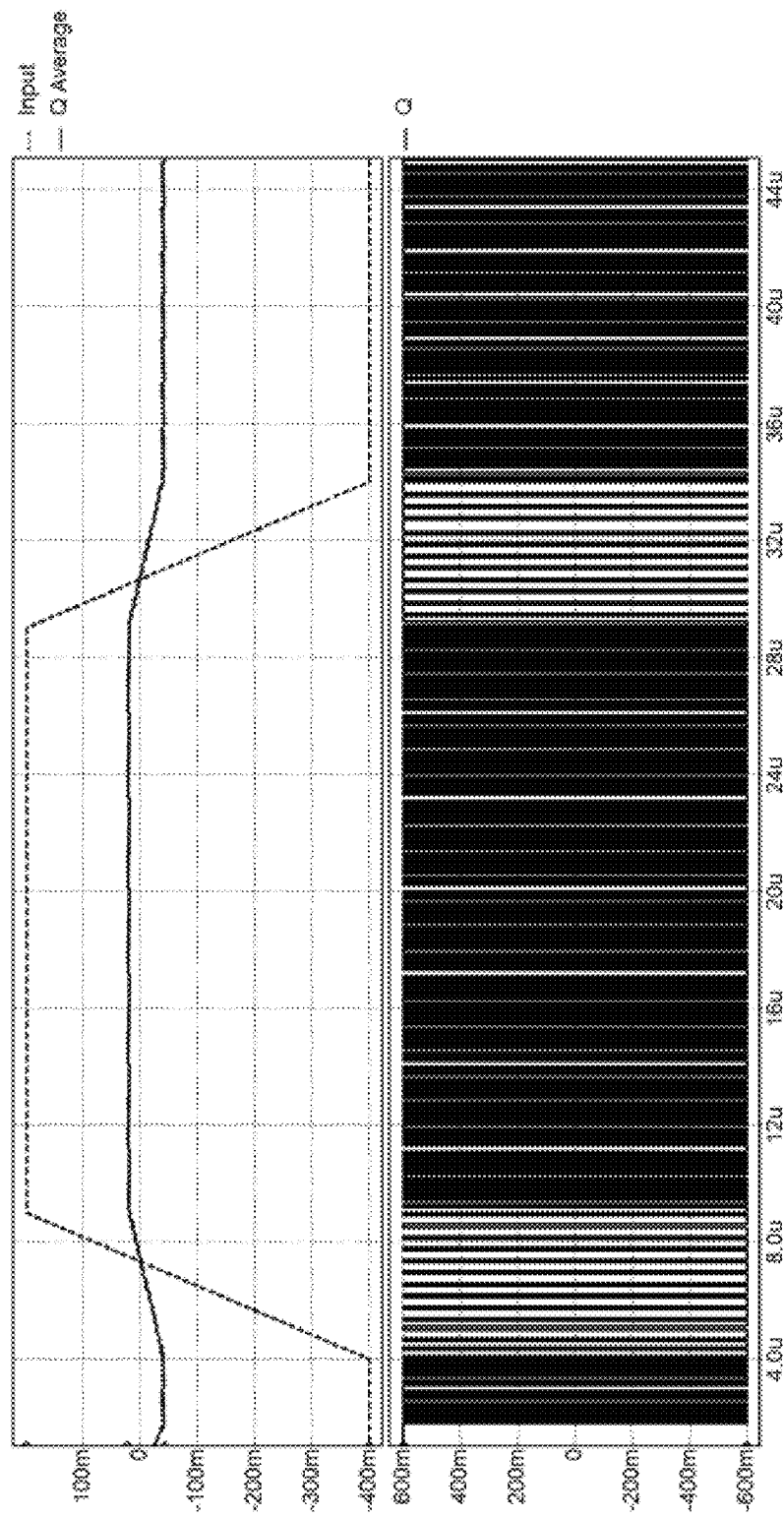
FIG. 6 shows graphs of signals in the circuit of FIG. 6.

FIG. 6 shows graphs of signals in the circuit of FIG. 5. If a finite rate of change in the input signal Ain is applied as shown by the curve "Input" on FIG. 6, the hybrid delta modulator 500 of FIG. 5 will track the change because it can match the slew rate of the signal. That is, the average current through resistor R1 in hybrid delta modulator 500 is such that the output of op-amp 508 is able to follow the changing input signal. Once the filter network has followed the input signal to its new value so that the signal from differencing element 502 to quantizer 504 is 0, the output pattern of Q values that will hold the loop in equilibrium is determined by the ratio of resistors R2 and R1.

For the graphs of FIG. 6, the value of resistor R2 is set to be 10 times the value of resistor R1, and the time constant R1 times C1 is 2.5 uS. Because R2/R1 is 10, the average value of the output Q is equal to 1/10 of the value of the input Ain when the input is not moving. In addition, when the signal has a finite slew rate, i.e., a finite rate of change, the loop does not saturate, and the graph in FIG. 6 shows transitions of the output Q as the input Ain moves.

By selecting the ratio of the value of resistor R2 to the value of resistor R1, and the time constant R1 times C1, the characteristic of the output pattern may be tailored to include an arbitrary combination of the input and the rate of change of the input. The characteristic from the Q-bar output of quantizer 504 to the input of differencing element 502 is given by the expression $-1/((R1/R2)+(s*C*R1))$ the time constant is therefore $C*R1$ and the limiting, i.e., maximum, gain is R2/R1.

Figure 7:
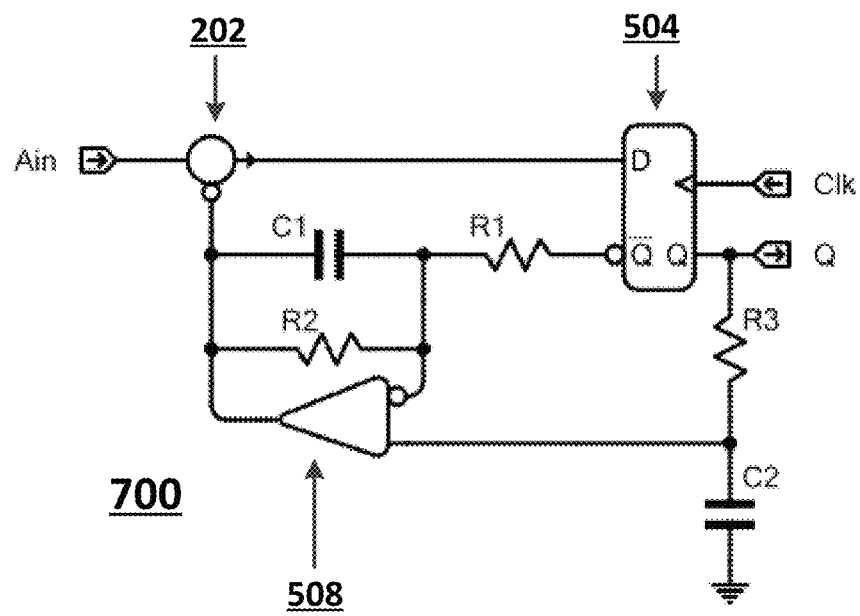
FIG. 7 is a diagram of a modified delta modulator that may be used in a neuron in layers of an AI network according to yet another embodiment of the present approach.

FIG. 7 is a diagram of a modified delta modulator that may be used as a neuron in one or more layers of an AI network according to yet another embodiment of the present approach. Hybrid delta modulator 700 is an alternative configuration achieving a more complex dependency on the signal and its derivative. It adds another resistor R3, connected to the output Q of quantizer 504, and another capacitor C2, connected between resistor R3 and ground. Where the second input of amplifier 508 is connected to ground in circuit 500 of FIG. 5, in circuit 700 the second input of amplifier 508 is connected to the junction between resistor R3 and capacitor C2. This results in there now being two time constants in the filter network, the same time constant R1 times C1 as in hybrid delta modulator 500 of FIG. 5, and a second time constant from resistor R3 and capacitor C2, but the principle is the same.

Those skilled in the art will recognize, in light of the teachings herein, that other configurations are possible, but a significant advantage of the present approach is that the output of the hybrid delta modulator is a combination of the output that would result from a sigma delta modulator, where the output signal is a quantized representation of the input signal, and the output that would result from a delta modulator, where the output signal is related to the derivative of the input signal.

As mentioned previously, when implemented in a neuron, a hybrid delta modulator as described in the present approach (or using a prior art delta modulator) receives a sum-of-products signal from a weighting circuit. While such weighting circuits are known in the art, a neuron containing one specific embodiment of a weighting circuit is shown in FIG. 8.

Figure 8:
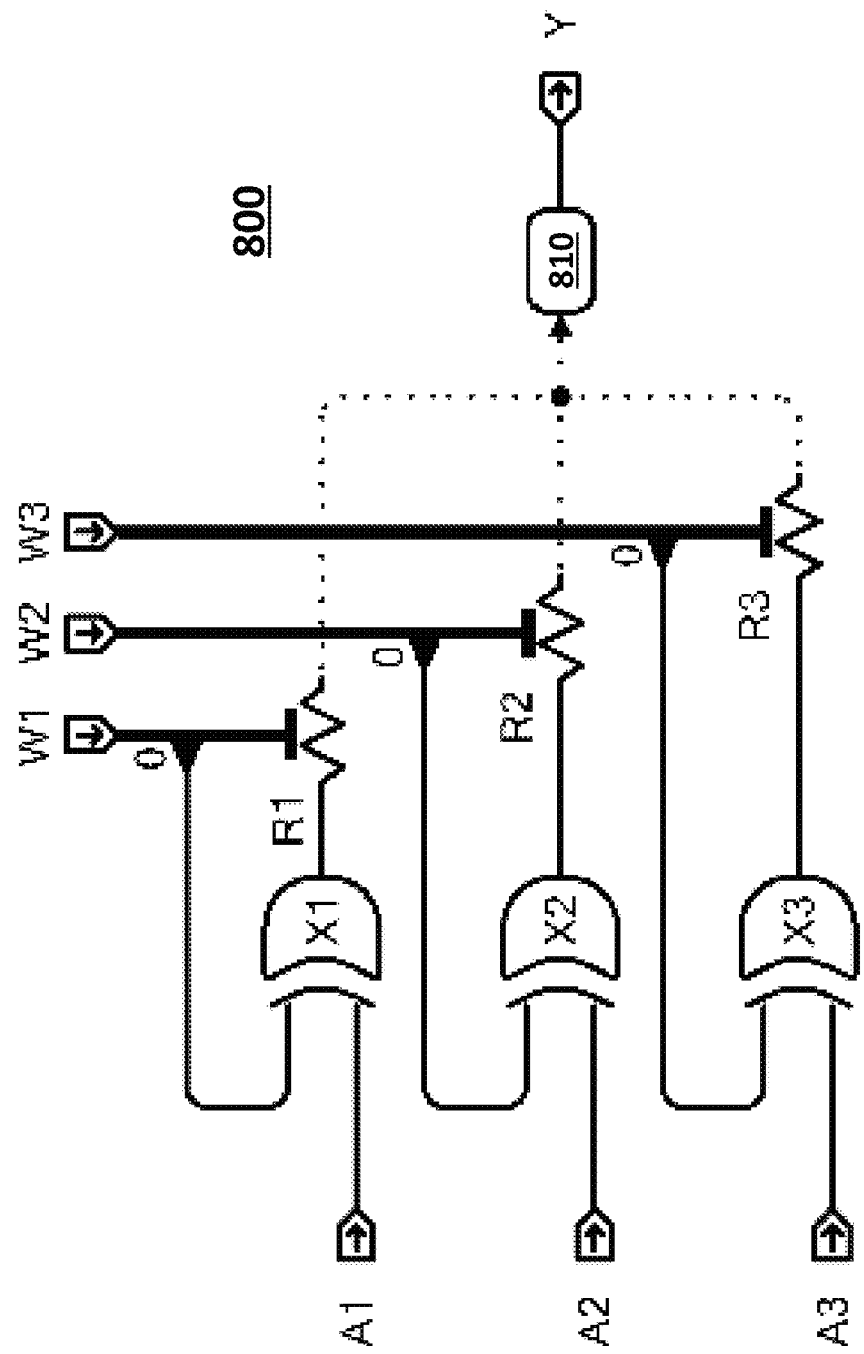
FIG. 8 is a diagram of a neuron that may be used in a neural network according to one embodiment of the present approach.

FIG. 8 is a diagram of a neuron 800 that may be used in a neural network according to one embodiment of the present approach, showing how a hybrid delta modulator can be used within a neuron in a neural network. For simplicity, as illustrated in FIG. 8, the delta modulator or hybrid delta modulator is shown only as element 810, but may be any of the embodiments as described and shown herein; for example, hybrid delta modulator 810 may be any of delta modulator 200 of FIG. 2, or hybrid delta modulators 300, 500 or 700 of FIG. 3, FIG. 5 or FIG. 7, respectively, or some similar circuit having the same functionality. As with the hybrid delta modulators discussed herein, the output signal is discrete and expressible on a single wire.

If a neuron is used as shown with analog addition of weighted signals, positive and negative quantities are easily represented. Three inputs A1, A2 and A3 are shown in FIG. 8 although any number of inputs Ai is possible; these are presumed to be digital values (possibly the result of a prior self-clocking circuit); in this context they are conceptually 1 or −1, and can be represented as −1 volt and +1 volt.

While weighting elements of fixed impedance may be used in a weighting circuit, in the illustrated neuron 800 the impedance elements R1, R2 and R3 are adjustable impedances that provide weights to the values of inputs A1 to A3. In one embodiment, the values of the impedance elements R1 to R3 may be programmed by signals on the W1, W2 and W3 busses respectively. (For any number Ai of inputs, there will typically be an equal number Ri of impedances and Wi of control busses.)

In the illustrated embodiment, the least significant bit (LSB, or zeroth bit) of the bus is used to change the sign of input signals A1, A2 and A3 input into exclusive-or (XOR) gates X1, X2 and X3 when necessary, and the bits of the signals other than the LSB are used to change the impedance value. (Again, each input signal A1, A2 and A3 is presumably a 1 or −1; in some cases the weights to be applied to these inputs may be negative, thus requiring a change in sign.)

The portion of neuron 800 including impedance elements R1, R2 and R3, XOR gates X1, X2 and X3, and the control busses W1, W2 and W3 (which may be generalized as Rn, Xn and Wn for some number n of input values) comprise a weighting circuit, as each input signal is given a weight by its associated resistor, and the weighted inputs then connect to a common point, i.e., are summed to become a sum-of-products signal, as is known in the art. The sum-of-products signal is then fed to the delta modulator or hybrid delta modulator 810 as the input signal Ain shown in the Figures above.

FIG. 8 also shows how the offset and activation function may be included in the sum-of-products signal. The offset and activation function are defined in the expression:

$$Y=F(Xi*Wi+C) \quad \text{(Equation 1)}$$

where there is an implied summation of the products Xi and Wi. F is the activation function and C is the offset.

In the present approach the offset C is implementable with a fixed input and variable weight. For example, in circuit 800, if the input signal A3 is tied low, i.e., at −1, then Equation 1 becomes:

$$Y=F(A1*W1+A2*W2-W3)$$

and control bus W3 becomes the offset control.

The activation function is inherent in the limiting of the output of hybrid delta modulator 810. That is, the hybrid delta modulator output stream can represent a number between +1 and −1 by oscillating between a low (−1) and a high (+1) value, but cannot go above +1 or below −1; the activation function is thus a hard clip to the range {−1, +1}.

The disclosed system has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than or in addition to those described above.

For example, as is well understood by those of skill in the art, various choices will be apparent to those of skill in the art. Further, the illustration of components and the associated feedback loops, etc., is exemplary; one of skill in the art will be able to select the appropriate number of resistors, capacitors, amplifiers and related elements that is appropriate for a particular application.

These and other variations upon the embodiments are intended to be covered by the present disclosure, which is limited only by the appended claims.

What is claimed is:

1. A neuron for use in a neural network, comprising:
   a weighting circuit configured to receive a plurality of input signals and produce a sum-of-products signal by weighting each of the input signals and adding the weighted input signals together; and
   a modulator circuit configured to receive the sum-of-products signal and produce a quantized output signal representing the sum-of-products signal.

2. The neuron of claim 1, wherein the modulator circuit further comprises:
   a differencing element configured to determine a difference between the sum-of-products signal and a filtered quantized output signal;
   a quantizer configured to produce the quantized output signal based upon the difference between the sum-of-products signal and the quantized output signal; and,
   a filter network configured to receive the quantized output signal and produce the filtered quantized output signal.

3. The neuron of claim 2, wherein the filter network further comprises:
   a resistor coupled at a first end to the quantized output signal and at a second end to an input of the differencing element; and
   a capacitor coupled at a first end to the second end of the resistor and at a second end to a ground.

4. The neuron of claim 2, wherein the quantizer is further configured to produce an output that is the inverse of the quantized output signal, and wherein the filter network further comprises:
   a first resistor having a first end connected to the inverse quantized output signal and a second end;
   a capacitor having a first end connected to the second end of the first resistor and a second end connected to an input of the differencing element;
   a second resistor having a first end connected to the second end of the first resistor and a second end connected to the second end of the capacitor; and
   an operational amplifier having a first input connected to the second end of the first resistor and a second input connected to a ground, and an output connected to the second end of the capacitor.

5. The neuron of claim 2, wherein the quantizer is further configured to produce an output that that is the inverse of the quantized output signal, and wherein the filter network further comprises:
   a first resistor having a first end connected to the inverse quantized output signal and a second end;
   a first capacitor having a first end connected to the second end of the first resistor and a second end connected to an input of the differencing element;

a second resistor having a first end connected to the second end of the first resistor and a second end connected to the second end of the first capacitor;

an operational amplifier having a first input connected to the second end of the first resistor and a second input, and an output connected to the second end of the first capacitor;

a third resistor having a first end connected to the quantized output signal and a second end connected to the second input of the operational amplifier; and a second capacitor having a first end connected to the second end of the third resistor and a second end connected to a ground.

6. The neuron of claim 1, wherein the weighting circuit further comprises a plurality of impedance elements, each impedance element having a first end configured to receive a different one of the plurality of input signals and a second end, the second ends of the plurality of impedance elements being connected together.

7. The neuron of claim 6, wherein each of the impedance elements has an impedance that is adjustable by a control signal.

8. The neuron of claim 7, wherein the weighting circuit further comprises:

a plurality of exclusive-or gates, each exclusive-or gate having a first input port configured to receive a different one of the plurality of input signals and a second input port configured to receive a control signal;

a plurality of impedance elements, each impedance element having a first end connected to the output port of a different one of the exclusive-or gates and a second end, the second ends of the plurality of impedance elements being connected together.

9. The neuron of claim 8 wherein the control signal instructs an exclusive-or gate to invert or not invert an input signal, of the plurality of input signals, received at the first input port of the exclusive-or gate.

* * * * *